US008833174B2

(12) United States Patent
Moore

(10) Patent No.: US 8,833,174 B2
(45) Date of Patent: Sep. 16, 2014

(54) PIEZOELECTRIC SENSOR BASED SMART-DIE STRUCTURE FOR PREDICTING THE ONSET OF FAILURE DURING DIE CASTING OPERATIONS

(75) Inventor: John Moore, Evergreen, CO (US)

(73) Assignee: Colorado School of Mines, Golden, CO (US)

( * ) Notice: Subject to any disclaimer, the term of this patent is extended or adjusted under 35 U.S.C. 154(b) by 1007 days.

(21) Appl. No.: 12/102,725

(22) Filed: Apr. 14, 2008

(65) Prior Publication Data

US 2008/0250863 A1 Oct. 16, 2008

Related U.S. Application Data

(60) Provisional application No. 60/911,345, filed on Apr. 12, 2007.

(51) Int. Cl.
*G01B 7/16* (2006.01)
*H01L 41/113* (2006.01)
*G01L 5/00* (2006.01)

(52) U.S. Cl.
CPC .......... *G01L 5/0047* (2013.01); *H01L 41/1132* (2013.01); *G01L 5/008* (2013.01)
USPC .......................................................... 73/776

(58) Field of Classification Search
USPC ..................................................... 73/760–860
See application file for complete search history.

(56) References Cited

U.S. PATENT DOCUMENTS

| | | | |
|---|---|---|---|
| 4,927,300 A | 5/1990 | Ramalingam et al. | |
| 5,766,782 A | 6/1998 | Ljungberg | |
| 5,851,687 A | 12/1998 | Ljungberg | |
| 6,229,190 B1 * | 5/2001 | Bryzek et al. | 257/419 |
| 6,333,103 B1 | 12/2001 | Ishii et al. | |
| 6,449,079 B1 * | 9/2002 | Herrmann | 359/214.1 |
| 6,566,983 B2 * | 5/2003 | Shin | 333/193 |
| 6,617,764 B2 * | 9/2003 | Sebastian et al. | 310/329 |
| 6,906,451 B2 * | 6/2005 | Yamada et al. | 310/324 |
| 7,096,921 B2 | 8/2006 | Moore et al. | |
| 7,274,134 B2 * | 9/2007 | Ohmori et al. | 310/366 |
| 7,301,212 B1 * | 11/2007 | Mian et al. | 257/415 |
| 7,323,953 B2 * | 1/2008 | Yokoyama et al. | 333/187 |
| 7,586,158 B2 * | 9/2009 | Hierlemann et al. | 257/369 |

* cited by examiner

*Primary Examiner* — Max Noori
(74) *Attorney, Agent, or Firm* — Sheridan Ross P.C.

(57) ABSTRACT

An in-situ apparatus is provided for monitoring the state of stress/strain and cracking in a die surface. The apparatus may also be used to facilitate the prudent removal of the die from the surface so that it may be repaired before catastrophic failure occurs. Accordingly, the yield of a process used to generate die cast structures may be greatly increased.

24 Claims, 1 Drawing Sheet

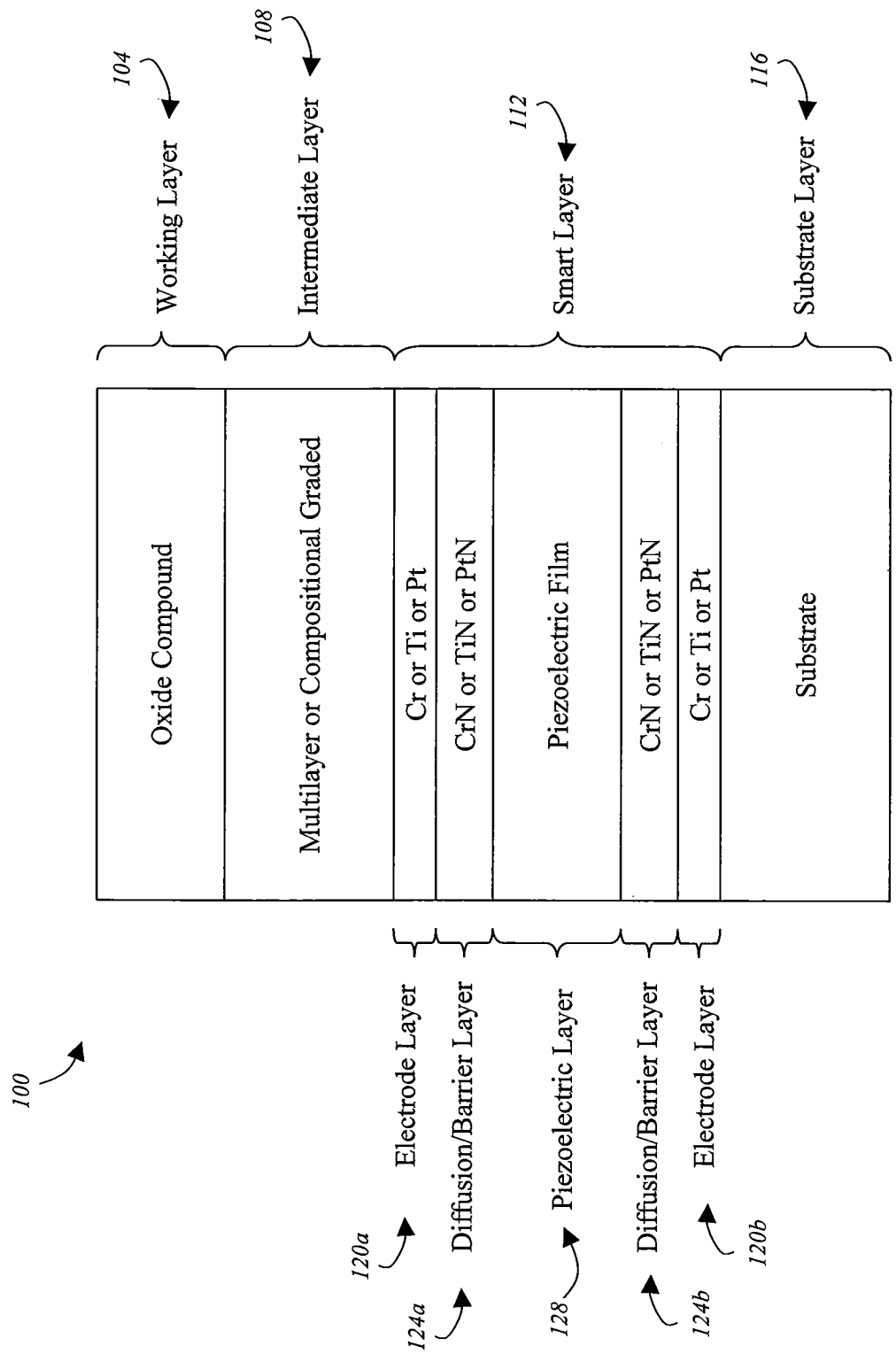

PIEZOELECTRIC SENSOR BASED SMART-DIE STRUCTURE FOR PREDICTING THE ONSET OF FAILURE DURING DIE CASTING OPERATIONS

CROSS-REFERENCE TO RELATED APPLICATIONS

This application claims the benefit of U.S. Provisional Application No. 60/911,345, filed Apr. 12, 2007, the entire disclosure of which is hereby incorporated herein by reference.

FIELD OF THE INVENTION

The invention relates to the extension of longevity of die casting dies for molten metals, especially aluminium, by surface engineering the die casting die and embedding a failure predicting mechanism within the working surface of the die.

BACKGROUND OF THE INVENTION

Die-casting is an important metallurgical process, which produces geometrically complex near net shaped metallic parts with excellent surface finish at a low scrap rate and high production rate. Due to the severe mechanical and thermal cyclic loading, die failure is a significant issue in die-casting that results in considerable energy consumption and wastage. It is therefore important for a die caster to delay the die failure as much as possible by adopting suitable protective measures.

Die surfaces may be protected by covering the active surface by a multilayered engineered coating that accommodates the thermal fatigue and provides good wear resistance. There has been significant progress in the die coating research that has resulted in the patents such as U.S. Pat. Nos. 6,333,103 to Ishii et al.; 5,766,782 and 5,851,687 to Ljungberg; and 7,096,921 to Moore. With the innovations disclosed in these patents, recent years have witnessed an extension of the die life by 3-100 times.

The severe conditions of die casting process still have a long-term detrimental effect on the properties of the die-protecting layer. The prolonged operation at these conditions can initiate a failure in the die coating, which can rapidly extend to the main die surface, again causing failure.

It is seen that, once severe cracking occurs in the coating, the die needs to be removed from production and the coating can be etched (removed) from the die surface by electro-chemical means and a fresh coating can be deposited on the same die thereby allowing it to be continually used for much longer times. The repair, however, is possible only when the failure is largely confined to the protective layer, without greatly propagating inside the actual tool steel die surface (substrate). The important issue, therefore, is to determine the point at which the protective surface coating approaches failure and indicates the need for its change.

This is why we intend to incorporate a 'smart' die coating system which is based on the development of a piezoelectric thin film sensor embedded in the optimized ACSEL coating (or any other coating system). In 1987, Ramalingam et al. from the University of Minnesota filed and obtained patent (U.S. Pat. No. 4,927,300) on the successful use of embedded piezoelectric sensors to measure the transient stress within a WC lathe machine part that is often subjected to periodic impulsive forces. The sensor operated at room temperature and generated periodic signals that were synchronous with the time varying force to which the tool is subjected. This invention was of more importance for monitoring unmanned machining systems in a production line and to optimise the machining production and performance.

Although technological advances have led to an extension of die life, there is still little technology available to predict structural problems with dies. To date, the problem of die wear monitoring is accomplished by observation of the die cavity and quality of the castings produced. It is a 'post mortem' procedure that does not allow the die caster to become aware of the problem until the problem is irreversible.

SUMMARY

The present innovation intends to protect the machining tool itself. Accordingly, and in accordance with at least one embodiment of the present invention, the mechanism may be embedded in the protective die-coating layer and may monitor the real time stress-strain during the time that the die is in actual use, and is cycled between room temperature and the melting point of the metal (e.g., aluminium) that is injected into the die cavity. It is thus one aspect of the present invention to have a high temperature piezoelectric sensor incorporated into the die. The onset of failure in the protective layer (coating system) is always accompanied by a sudden increase in the stress level, which the sensor is operable to detect. Once this increase in stress level is detected, a number of different precautionary measures may be adopted such as removing the die from further use. Of course, other precautionary measures may be adopted if the precursor stress level is detected.

In accordance with one embodiment of the present invention, a die for use in die casting operations is provided. Generally, the die comprises:

a protective die-coating layer; and a piezoelectric sensor incorporated in the protective die-coating layer, wherein the piezoelectric sensor is adapted to translate stress and/or strain within the protective die-coating layer to a voltage signal.

In accordance with another embodiment of the present invention, a method of manufacturing a die for use in die casting operations is provided. Generally, the method comprises:

providing a protective die-coating layer; and incorporating a piezoelectric sensor in the protective die-coating layer, wherein the piezoelectric sensor is adapted to translate stress and/or strain within the protective die-coating layer to a voltage signal.

In accordance with one embodiment of the present invention, the piezoelectric sensor is developed and incorporated in the above-mentioned protective design. Piezoelectric sensors have been widely used for a variety of applications ranging from household gadgets to underwater communications. The stresses developed within a die casting tool are highly dynamic in nature and need to overcome the stray signals due to the leakage current present within the sensor medium that are much slower varying in time. A series of sensor arrays may be implanted within the die coating, which will indicate the stress distribution at different locations in the coating system and body of the die. The smaller the size of the active medium, the further is the natural frequency from the working time scale and the smaller the influence of resonance, provided the size of the sensor element is large enough to produce a detectable signal.

Embodiments of the present invention make use of the transverse piezoelectric property of the active material. The stress will be mainly along the plane of the protective coating, and the signal is easy to measure in the direction perpendicular to plane of the film.

The choice of material is an important issue due to the degradation of piezoelectric properties in most materials subjected to die casting temperatures (>600° C.). It is known that ferroelectric materials possess very high piezoelectric coefficients, and are, most of the time, the natural choice when operations below the Curie temperature ($T_c$) is concerned. In embodiments of the present invention, a ferroelectric material with a very high Curie point, or a non-ferroelectric piezoelectric material, that does not exhibit any phase transition at all is desirable. There are several materials that can be considered for this application, such as $LiNbO_3$ (Ferroelectric, $T_c$=1210° C.), $Bi_4Ti_3O_{12}$ (Ferroelectric, $T_c$=650-800° C. (depending upon doping)), ZnO (non-ferrolectric, no Curie point) and AlN (non-ferroelectric, and no Curie point). Since the protective layer is a derivative of a multi-layer graded die coating system, such as Ti—TiN—TiAlN or Cr—CrN—CrAlN, it would be more straightforward and practical to use an AlN piezoelectric thin film within the coating, since the mechanical and chemical compatibility of the AlN sensor material embedded within these multi-layer graded coating systems is satisfactory.

One interesting difference between ferroelectric and non-ferroelectric sensors is the linear response of non-ferroelectrics, which is intimately related to their hysteretic nature. For large amplitude of the stress-strain cycle a ferroelectric material will exhibit a significant hysteresis and also a non-linearity, and thereby introduce a "memory effect" in stress instead of measuring the instantaneous stress.

AlN does exhibit a stronger anisotropy than most of the usual ferroelectrics such as PZT. The piezoelectric properties in AlN are restricted to the axis of its hexagonal unit cell, and measured along that direction. On the other hand, the most commonly used PZT has 6 polar axes, and hence one has a lot of flexibility to pack a ceramic consisting of randomly oriented tiny PZT crystals without making a great compromise in the resulting properties. There is, however, one unique characteristic of AlN, which relieves itself from this problem. Due to the lowest energy of the a-b plane (the plane in which the base of the hexagon lies in the unit cell), the material, when grown in thin film form, will try to minimise the energy of the largest surface, which is the plane of the film, and that will coincide with the a-b plane of hexagonal AlN, thereby forcing it to show maximum sensitivity along the transverse direction, which, in thin film structures, happens to be the easiest direction of measuring any electrical properties.

This material is quite easy to form. During its simpler structure and ease of formation it does not require any complicated processing unit. AlN with very good orientation can be obtained by any one of DC, RF and pulsed DC magnetron reactive sputtering. Being a simple formula, it does not require stringent control of too many components, and makes it possible to deposit the pure AlN compound. AlN is also very stable at high temperature, except when used in contact with oxygen, which converts it to the lower energy $Al_2O_3$ phase. This is why it is important to test and use the sensor structure in an inert atmosphere to prevent metal oxidation, which will be the case in most metal casting systems. The insulating layer in which the element is embedded also acts as a protective layer to the oxidation of the AlN sensor layer.

Another advantage of AlN is its very high electrical resistivity ($>10^{11}$-$10^{13}$ $\Omega\cdot$cm), which keeps the stress induced piezoelectric signal alive well after the signal is removed. If, however, a very rapid change of stress is to be monitored, the resistivity can be reduced by slight compositional modification and the "memory-effect" can be completely nullified. It was also found that the thickness has a strong impact on the electrical insulation property of this interesting material, which indicates the role of surface effects and porosity in the charge conduction through the deposited AlN films. The maximum thickness at which a complete insulation can be achieved is of the order of 1-1.2 micron.

For accessing the piezoelectric signal, one has to make electrical contacts that will be isolated from each other as well as the rest of the matrix, which is electrically conducting. In order to protect the signals from the conduction loss within the matrix an additional coating of electrically insulating material, such as non-piezoelectric boron nitride, can be adopted around the sensor element such as is described in U.S. Pat. No. 4,927,300. Boron nitride is a well-known compound with excellent electrical resistivity, thermal conductivity and high oxidation resistance.

It is therefore a proposal of embodiments of the present invention to deposit this material by reactive DC and pulsed DC magnetron sputtering. Sputtering is a technique that delivers a controlled high energy to the adatoms and hence results in a well-defined crystalline material at a relatively low deposition temperature, e.g., 250° C. or less. The low deposition temperature is important to maintain the integrity of the host structure in which it is being embedded. By proper choice of the power and energy it is possible to obtain a dense film with the required engineered crystalline orientation and microstructure. For instance, deposition of AlN at a higher power may yield a c-axis orientation in both DC and pulsed DC sputtered films. The pulsed DC sputtered films are known to have a high density. A perpendicular columnar microstructure may be favourable due to the reduced depolarizing field along the axis of the column, which is indeed the direction of the piezoelectric polarisation. Appendix A shows and describes both direct DC sputtering and pulsed DC sputtering techniques that may be employed to create a piezoelectric sensor layer in a die.

The use of pulsed DC sputtering allows the formation of a phase at a much lower power density than pure DC sputtering. At a similar sputtering power level, pure DC sputtering revealed a poor crystallinity as compared to films created by pulsed DC sputtering techniques. Furthermore, films formed by pulsed DC sputtering techniques contained out-of-plan as well as in-plan stress. This indicates a much higher energy carried by pulsed sputtered atoms. Furthermore, increasing the density (minimizing porosity) of the AlN thin film (e.g., by increasing the film thickness from about 0.2 microns to about 0.9 microns, and by using pulsed magnetron sputtering at an increased pulse frequency) helps increase the piezoelectric response of the piezoelectric film. Additionally, use of a TiN thin film barrier layer may increase the piezoelectric response of the film. As the piezoelectric response is increased, so too is the sensitivity of the film to changes in stress, thereby affording a more accurate and precise piezoelectric sensor. It should also be noted that the piezoelectric response might vary as a function of the operating temperature.

One characteristic of sputtered thin films, particularly the pulsed sputtered films, is the presence of controllable residual stress through pulsing parameters. This stress can tune the properties significantly, and still not introduce any memory effects in the measured piezoelectric signal for a periodic/cyclic stress-strain operation.

The coating system requires an adhesion layer of Ti, Cr, W, etc., in order to bond with the tool steel substrate. The adhesion layer can also initiate a c-axis growth in the overlying AlN films, due to the similar crystal structures, and the preferred growth of the Ti, (or Cr, W etc.) along the c-direction. If diffusion of the adhesion layer metal (Ti, Cr, W etc.) occurs in the film, a buffer layer of TiN may be used to bridge the AlN film with the adhesion layer. The insertion of the TiN layer would not change the electrical properties, due to the conducting nature of the TiN film. One advantage of using Ti or Cr as the adhesion layer is that thin films of Ti or Cr can also act as thin film electrodes for the AlN piezoelectric thin film that is sandwiched between the electrodes.

A Pt electrode layer may also be introduced instead of the TiN layer in some of the piezoelectric thin film systems. The Pt layer does not have as good a lattice matching with AlN, but it was seen to have a very good preferred oriented growth, which forced the overlying AlN to completely grow along the c-direction. It is worthwhile to mention that the atomic arrangement in <111> oriented Pt (hexagonal) is the same as that in a c-axis oriented AlN.

Additional features and advantages of embodiments of the present invention will become more readily apparent from the following description, particularly when taken together with the accompanying drawings.

BRIEF DESCRIPTION OF THE DRAWINGS

FIG. 1 depicts a schematic diagram of a smart die coating architecture in accordance with embodiments of the present invention.

DETAILED DESCRIPTION

With reference now to FIG. 1, an exemplary smart die 100 coating architecture will be described in accordance with at least some embodiments of the present invention. The die 100 structure may include a working layer 104, an intermediate layer 108, a smart layer 112, and a substrate layer 116. One or more of the layers may be deposited on the substrate layer 116 via a thin film deposition process as will be discussed in further detail below. The working layer 104 is generally the outermost layer of the die 100. Thus, the working layer 104 is generally the layer of the die 100 that contacts the material that is being die-cast. The working layer 104 should preferably be composed of a material that interfaces well with the material being die-cast. For example, an oxide compound may be used for die-casting operations where aluminium or similar metals are die-cast. A first surface (e.g., the outermost surface) of the working layer 104 may be the side that physically contacts the material that is being die-cast.

The intermediate layer 108 may include any multilayer or compositional graded combination of materials. As one example, the intermediate layer 108 may include either Ti—TiN—TiAlN or Cr—CrN—CrAlN. A first surface (e.g., the outermost surface) of the intermediate layer 108 may be adjacent to a second surface (e.g., the innermost surface) of the working layer 104. An opposing second surface of the intermediate layer 108 may be adjacent to a first surface (e.g., the outermost surface) of the smart layer 112.

In accordance with at least some embodiments of the present invention, the smart layer 112 may comprise a piezoelectric layer 128 that is located between electrode layers 120. The piezoelectric layer 128 may be separated from the electrode layers 120 by diffusion/barrier layers 124. In accordance with one embodiment of the present invention, the piezoelectric layer 128 comprises two immediately adjacent diffusion/barrier layers 124a, 124b that are located on opposite sides of the piezoelectric layer 128. On the outer surface of each diffusion/barrier layer 124a, 124b there may be an electrode layer 120a, 120b that carries the current from the piezoelectric layer 128 to a point where the current or changes in the current can be measured.

In accordance with at least one embodiment of the present invention, the electrode layers 120a, 120b may be composed of an electrically conducting material. For example, the electrode layers 120a, 120b may comprise Ti, Cr, or Pt. Generally speaking, each electrode layer 120a, 120b may comprise the same material. However, certain embodiments of the present invention can be envisioned where the first electrode layer 120a comprises a first material (e.g., Cr) and the second electrode layer 120b comprises a second different material (e.g., Ti).

The diffusion/barrier layers 124a, 124b may be provided to control the amount of current that passes out of the piezoelectric layer 128 to the electrode layers 120a, 120b. In accordance with at least one embodiment of the present invention, the diffusion/barrier layers 124a, 124b may comprise a nitride. More specifically, the diffusion/barrier layers 124a, 124b may comprise a metallic nitride that has the same or similar metal as the adjacent electrode layer 120a, 120b. For example, the diffusion/barrier layers 124a, 124b may comprise CrN, TiN, or PtN. In accordance with one exemplary embodiment, the material used in the diffusion/barrier layer 124a, 124b may depend upon the material that was used in the electrode layer 120a, 120b. For instance, if the first electrode layer 120a is composed of Cr, then the adjacent first diffusion/barrier layer 124a may be composed of CrN. This provides the advantage of a good interaction between the adjacent electrode layer 120 and diffusion/barrier layer 124 since each has the same metallic properties. It can be appreciated by one skilled in the art, however, that the metallic material used for the diffusion/barrier layer 124 may not correspond to the material used in the electrode layer 120. Thus, there may be certain embodiments of the present invention that employ an electrode layer 120 of Ti with an adjacent diffusion/barrier layer 124 of PtN or CrN.

The piezoelectric layer 128 may be composed of any suitable piezoelectric material. The types of materials that may be used in the piezoelectric layer 128 may include, but are not limited to, $LiNbO_3$, $Bi_4Ti_3O_{12}$, ZnO, and AlN. In a preferred embodiment of the present invention, the piezoelectric layer 128 may comprise AlN due to its various beneficial properties. More specifically, advantages of using AlN include the fact that AlN has a very high electrical resistivity ($>10^{11}$-$10^{13}$ $\Omega \cdot cm$), which keeps the stress induced piezoelectric signal alive well after the signal is removed. Moreover, the orientation of AlN can be controlled relatively easily. In accordance with at least some embodiments of the present invention, a preferred piezoelectric layer 128 may comprise a relatively high degree of (002) orientation. A number of deposition parameters may be altered when creating the piezoelectric layer 128 to maximize its (002) orientation. More particularly, the deposition factors that can affect the growth orientation may include deposition pressure, the underlay (e.g., substrate and/or diffusion/barrier layer 124) structure/material, power pulse frequency, and whether AC or DC bias sputtering is used. In accordance with at least one embodiment of the present invention, a pulsed-closed field unbalanced magnetron sputtering (PCFUBM) deposition process may be employed when creating the piezoelectric layer 128.

As noted above, the (002) orientation growth of the piezoelectric layer 128 may be adjusted by controlling the magnetron sputtering parameters. The fraction of (002) orientation refers to the ratio of the peak intensity of the (002) reflection over the sum of the peak intensities of all the reflections in the X-Ray Diffraction (XRD) pattern. The adjusted parameters may involve pulse frequency, chamber pressure, substrate bias and underlayer. Constant parameters may include power, pulsing reverse time, and flow rate ratio of N2/Ar. The fraction of (002) may be maximized when the power pulse frequency is within the range of 150-250 KHz. Higher than 300 KHz or DC power has been shown to exhibit a lower degree of (002) growth. However, when there is a layer of AlN deposited at 200 KHz, followed by DC deposition, highly oriented (002) growth may also be obtained, which indicated that the initial textured structure could favor the followed textured growth even deposited at disadvantaged conditions. On the other hand, when there is a layer of CrN is used for the diffusion/barrier layer 124b under the AlN of the piezoelectric layer 128, the fraction of (002) can be significantly reduced even though the AlN is deposited under desired conditions. Applying 50 V bias on substrate, the orientation growth will be affected slightly. The film deposited at 5 mTorr demonstrated over 99% of (002) growth. Above all, the mean factors that affected the growth orientation involved pressure, underlay structure, power pulse frequency, and bias.

The smart layer 112 may be deposited on the substrate layer 116. One of the electrode layers 120 may be the layer that is in contact with the substrate layer 116. In accordance with at least one embodiment of the present invention, the substrate layer 116 may comprise any metal or similar material that has a higher melting temperature than the material being die cast. For instance, if the material being die cast is aluminium, then the substrate layer 116 may be composed of steel or the like.

The foregoing discussion of the invention has been presented for purposes of illustration and description. Furthermore, the description is not intended to limit the invention to the form disclosed herein. Consequently, variations and modifications commensurate with the above teachings, within the skill and knowledge of the relevant art, are within the scope of the present invention. The embodiments described hereinabove are further intended to explain the best modes presently known of practicing the invention and to enable others skilled in the art to utilize the invention in such, or in other embodiments, and with the various modifications required by their particular application or use of the invention. It is intended that the appended claims be construed to include alternative embodiments to the extent permitted by the prior art.

What is claimed is:

1. A die for use in die casting operations, comprising:
   a protective die-coating layer having a first surface that contacts material during die-casting processes; and
   a piezoelectric sensor incorporated in the protective die-coating layer, wherein the piezoelectric sensor is adapted to translate at least one of stress and strain created within the protective die-coating layer during a die-casting process to a voltage signal, wherein the piezoelectric sensor substantially comprises a (002) orientation thereby increasing sensitivity of the piezoelectric sensor to stresses imparted along the plane of the protective coating during the die-casting process.

2. The die of claim 1, wherein the stresses are measured in a direction perpendicular to the plane of the protective coating.

3. The die of claim 1, wherein the voltage signal is measured in a direction substantially perpendicular to the protective die-coating layer.

4. The die of claim 1, wherein the piezoelectric sensor comprises at least one of a ferroelectric material having a relatively high Curie point or a non-ferroelectric piezoelectric material.

5. The die of claim 4, wherein the piezoelectric sensor comprises at least one of $LiNbO_3$, $Bi_4Ti_3O_{12}$, and ZnO.

6. The die of claim 4, wherein the piezoelectric sensor comprises AlN.

7. The die of claim 1, wherein an orientation of material in the piezoelectric sensor consists essentially of a (002) orientation.

8. The die of claim 1, wherein the protective die-coating layer comprises a multi-layer graded die coating system.

9. The die of claim 1, further comprising:
   at least one electrode layer situated between the piezoelectric sensor and the first surface of the die-coating layer.

10. The die of claim 9, further comprising:
    a diffusion/barrier layer situated between the piezoelectric sensor and the at least one electrode layer.

11. The die of claim 10, wherein the at least one electrode layer comprises at least one of Cr, Ti, and Pt and the diffusion/barrier layer comprises at least one of CrN, TiN, and PtN.

12. A method of making a die for use in a die casting operation, comprising:
    providing a protective die-coating layer having a first surface that contacts material during die-casting processes; and
    incorporating a piezoelectric sensor in the protective die-coating layer, wherein the piezoelectric sensor is adapted to translate at least one of stress and strain created within the protective die-coating layer during the die casting operation to a voltage signal, wherein the piezoelectric sensor substantially comprises a (002) orientation achieved by controlling magnetron sputtering parameters used to incorporate the piezoelectric sensor in the protective die-coating layer.

13. The method of claim 12, wherein the translated stress is substantially along the plane of the protective coating.

14. The method of claim 12, wherein the voltage signal is measured in a direction substantially perpendicular to the protective die-coating layer.

15. The method of claim 12, wherein the piezoelectric sensor comprises at least one of a ferroelectric material having a relatively high Curie point and a non-ferroelectric piezoelectric material.

16. The method of claim 15, wherein the piezoelectric sensor comprises at least one of $LiNbO_3$, $Bi_4Ti_3O_{12}$, and ZnO.

17. The method of claim 15, wherein the piezoelectric sensor comprises AlN.

18. The method of claim 12, wherein an orientation of material in the piezoelectric sensor consists essentially of a (002) orientation.

19. The method of claim 12, wherein the protective die-coating layer comprises a multi-layer graded die coating system.

20. The method of claim 12, further comprising:
    providing at least one electrode layer between the piezoelectric sensor and the first surface of the die-coating layer.

21. The method of claim 20, further comprising:
    providing a diffusion/barrier layer between the piezoelectric sensor and the at least one electrode layer.

22. The method of claim 21, wherein the at least one electrode layer comprises at least one of Cr, Ti, and Pt and the diffusion/barrier layer comprises at least one of CrN, TiN, and PtN.

23. The die of claim 6, wherein the piezoelectric sensor comprises a maximum thickness of about 1.2 micron.

24. The method. of claim 17, wherein the piezoelectric sensor comprises a maximum thickness of about 1.2 micron.

* * * * *